United States Patent
Lee et al.

(10) Patent No.: US 12,363,937 B2
(45) Date of Patent: Jul. 15, 2025

(54) MULTI-GATE DEVICE AND RELATED METHODS

(71) Applicant: Taiwan Semiconductor Manufacturing Company, Ltd., Hsinchu (TW)

(72) Inventors: Tsung-Lin Lee, Hsinchu (TW); Choh Fei Yeap, Hsinchu (TW); Da-Wen Lin, Hsinchu (TW); Chih-Chieh Yeh, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/755,342

(22) Filed: Jun. 26, 2024

(65) Prior Publication Data

US 2024/0347627 A1  Oct. 17, 2024

Related U.S. Application Data

(62) Division of application No. 17/465,762, filed on Sep. 2, 2021, now Pat. No. 12,040,383.

(Continued)

(51) Int. Cl.
*H10D 30/00* (2025.01)
*H01L 21/02* (2006.01)
(Continued)

(52) U.S. Cl.
CPC ....... *H10D 30/031* (2025.01); *H01L 21/0259* (2013.01); *H01L 21/28123* (2013.01);
(Continued)

(58) Field of Classification Search
CPC ........... H01L 29/0673; H01L 29/42392; H01L 29/78696; H01L 29/78621; H10D 30/501;
(Continued)

(56) References Cited

U.S. PATENT DOCUMENTS 8,796,666 B1  8/2014  Huang
8,815,712 B2  8/2014  Wan
(Continued)

FOREIGN PATENT DOCUMENTS

TW  201913754 A  4/2019
TW  202109891 A  3/2021

*Primary Examiner* — Reema Patel
(74) *Attorney, Agent, or Firm* — Haynes and Boone, LLP

(57) ABSTRACT

A method of fabricating a device includes providing a fin extending from a substrate, where the fin includes an epitaxial layer stack having a plurality of semiconductor channel layers interposed by a plurality of dummy layers. In some embodiments, the method further includes removing a portion of the epitaxial layer stack within a source/drain region of the semiconductor device to form a trench in the source/drain region that exposes lateral surfaces of the plurality of semiconductor channel layers and the plurality of dummy layers. After forming the trench, in some examples, the method further includes performing a dummy layer recess process to laterally etch ends of the plurality of dummy layers to form first recesses along a sidewall of the trench. In some embodiments, the method further includes conformally forming a cap layer along the exposed lateral surfaces of the plurality of semiconductor channel layers and within the first recesses.

20 Claims, 16 Drawing Sheets

Related U.S. Application Data

(60) Provisional application No. 63/200,434, filed on Mar. 5, 2021.

(51) Int. Cl.
  *H01L 21/28* (2006.01)
  *H01L 21/764* (2006.01)
  *H10D 30/01* (2025.01)
  *H10D 30/67* (2025.01)
  *H10D 62/10* (2025.01)
  *H10D 64/01* (2025.01)
  *H10D 64/66* (2025.01)

(52) U.S. Cl.
  CPC ....... *H01L 21/764* (2013.01); *H10D 30/6715* (2025.01); *H10D 30/6735* (2025.01); *H10D 30/6739* (2025.01); *H10D 30/6757* (2025.01); *H10D 62/118* (2025.01); *H10D 62/121* (2025.01); *H10D 64/017* (2025.01); *H10D 64/018* (2025.01); *H10D 64/679* (2025.01)

(58) Field of Classification Search
  CPC .. H10D 30/503; H10D 30/504; H10D 30/506; H10D 30/507; H10D 30/508; H10D 30/6735
  See application file for complete search history.

(56) References Cited

U.S. PATENT DOCUMENTS

| | | |
|---|---|---|
| 8,963,258 B2 | 2/2015 | Yu |
| 9,093,530 B2 | 7/2015 | Huang |
| 9,171,929 B2 | 10/2015 | Lee |
| 9,214,555 B2 | 12/2015 | Oxland |
| 9,236,267 B2 | 1/2016 | De |
| 9,520,482 B1 | 12/2016 | Chang |
| 9,548,303 B2 | 1/2017 | Lee |
| 9,576,814 B2 | 2/2017 | Wu |
| 2013/0285116 A1 | 10/2013 | Lochtefeld |
| 2018/0342596 A1 | 11/2018 | Lee |
| 2019/0123163 A1 | 4/2019 | Yang |
| 2019/0341450 A1 | 11/2019 | Lee |
| 2020/0266060 A1 | 8/2020 | Cheng |
| 2020/0357911 A1 | 11/2020 | Frougier |

MULTI-GATE DEVICE AND RELATED METHODS

CROSS-REFERENCE TO RELATED APPLICATION

This application is a divisional of U.S. patent application Ser. No. 17/465,762, filed Sep. 2, 2021, which claims the benefit of U.S. Provisional Application No. 63/200,434, filed Mar. 5, 2021, the entireties of which are incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA transistors get their name from the gate structure which extends completely around the channel, providing better electrostatic control than FinFETs. FinFETs and GAA transistors are compatible with conventional complementary metal-oxide-semiconductor (CMOS) processes and their three-dimensional structure allows them to be aggressively scaled while maintaining gate control and mitigating SCEs.

In general, GAA transistors may be implemented, for example, in cases where FinFETs can no longer meet performance requirements. However, fabrication of GAA transistors has introduced new challenges to the semiconductor manufacturing process and has led to associated device reliability concerns. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
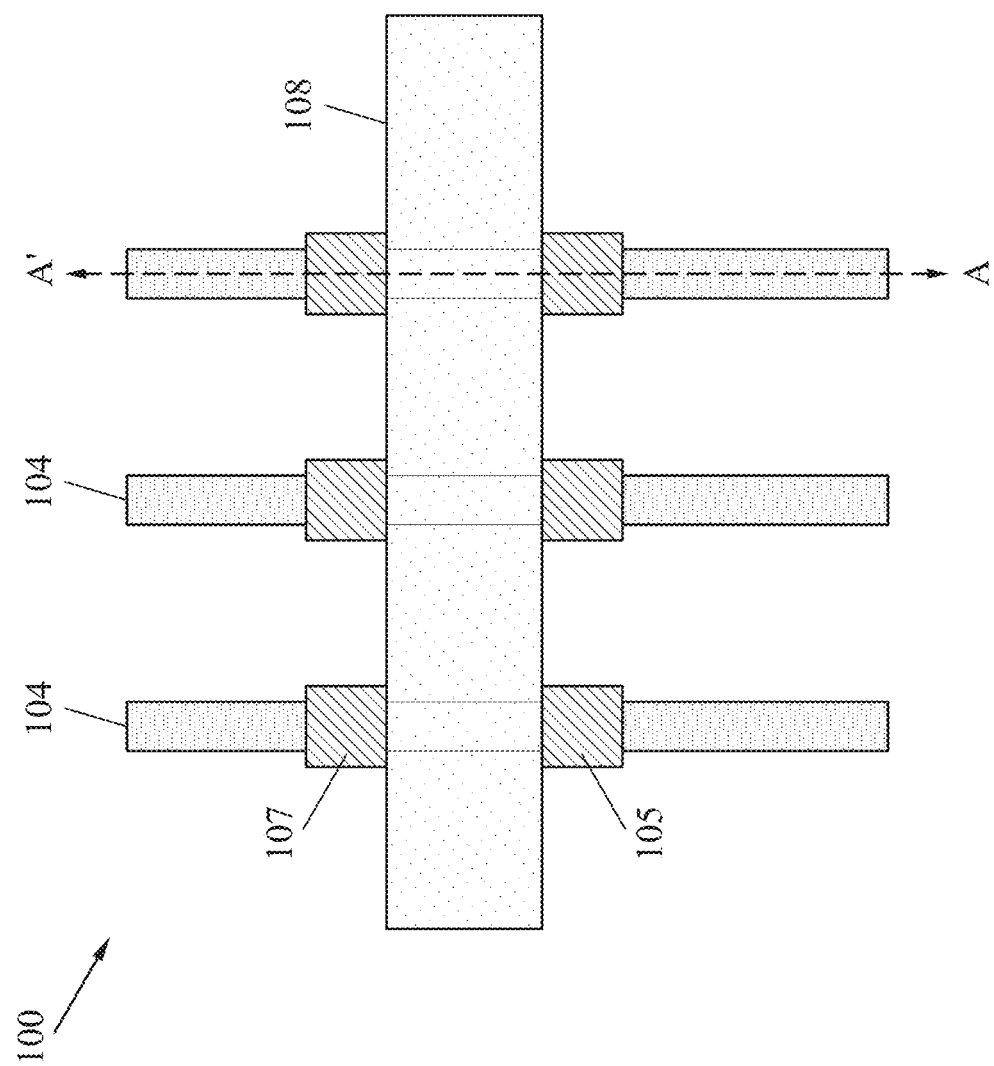
FIG. 1 provides a simplified top-down layout view of a multi-gate device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FinFETs, on account of their fin-like structure. Also presented herein are embodiments of a type of multi-gate transistor referred to as a gate-all-around (GAA) transistor. A GAA transistor includes any device that has its gate structure, or portion thereof, formed on 4-sides of a channel region (e.g., surrounding a portion of a channel region). Devices presented herein also include embodiments that have channel regions disposed in semiconductor channel layers. In various embodiments, the semiconductor channel layers may include nanosheet channel(s), nanowire channel(s), bar-shaped channel(s), and/or other suitable channel configurations. Presented herein are embodiments of devices that may have one or more channel regions (e.g., semiconductor channel layers) associated with a single, contiguous gate structure. However, one of ordinary skill would recognize that the teaching can apply to a single channel (e.g., single semiconductor channel layer) or any number of channels. One of ordinary skill may recognize other examples of semiconductor devices that may benefit from aspects of the present disclosure.

In at least some existing implementations, current crowding at a lightly-doped drain (LDD) region has remained an issue, and the strain efficiency from a source/drain (S/D) region to channel region has been poor. This has been due in part to a variety of process-related issues. For example, in some cases, it may be difficult to remove a thin dummy layer (interposing adjacent semiconductor channel layers) during a replacement gate (RPG) process. In addition, device performance may be degraded by non-uniform layer thicknesses, for example of the semiconductor channel layers, which in some cases may be caused by a sheet trim process at RPG to form an H-shaped (or dog-boned shaped) semiconductor channel layer.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing multi-gate devices (e.g., such as a GAA transistors) having an H-shaped (or dog-boned shaped) semiconductor channel layer while simultaneously overcoming various existing challenges. In some examples, devices fabricated in accordance with the present embodiments provide for better current spreading at the LDD region, which in turn results in reduced resistances (e.g., Rov, Rextension). At least some embodiments also provide for stronger channel strain efficiency from a S/D stressor. Further, various embodiments provide for good short-channel control by keeping a thin sheet height structure (e.g., thin semiconductor channel layer).

In some embodiments, a thin semiconductor channel layer thickness in an epitaxially grown super lattice (e.g., the super lattice including alternating semiconductor channel layers and dummy layers) is possible, while having less (or no) sheet trim at RPG, thereby improving uniformity of the semiconductor channel layer thickness. Further, in some embodiments, a thinner semiconductor channel layer thickness may correspond to a thicker dummy layer thickness, where the thicker dummy layer helps to facilitate removal of the dummy layer at RPG and improves metal gate gap fill or multi work-function metal patterning.

In various embodiments, the H-shaped (or dog-bone shaped) semiconductor channel layer may be formed during a S/D process (e.g., such as a S/D etch process and optionally a subsequent dummy layer recess process). Generally, and in some embodiments, a thicker semiconductor channel layer under a gate sidewall spacer (at least partially defining the H-shape or dog-bone shape) may be used to reduce the risk of current crowding, while also providing a more uniform semiconductor channel layer (e.g., due to less sheet trim) to provide better short-channel control. In addition, at least some aspects of the various embodiments and advantages discussed herein are enabled by the use of an additional silicon (Si) cap layer that is formed after the dummy layer recess and before inner spacer formation, as discussed herein. In some examples, the extra Si cap layer may also help to prevent inner spacer and S/D damage during the dummy layer removal process. In some cases, the extra Si cap layer may contribute to the thicker semiconductor channel layer under the gate sidewall spacer.

Generally, and in some embodiments, devices fabricated in accordance with the various methods of the present disclosure may provide for: (i) uniform and thin sheet thickness during super lattice (semiconductor channel layers/dummy layers) formation, (ii) improved sheet formation and work-function metal patterning process at RPG (e.g., a thicker dummy layer is provided due to a thinner semiconductor channel layer, with overall device height remaining substantially constant), (iii) more uniform sheet height along channel due to less (or no) sheet trim at RPG, (iv) stronger channel strain efficiency from S/D stressor by H-shaped (or dog-bone shaped) semiconductor channel layer under spacer, (v) less current crowding by H-shaped (or dog-bone shaped) extension region, (vi) better Rov/Rextension resistances due to surface passivation and better interfaces (e.g., less defects/Dit) between inner spacer and semiconductor channel layer, (vii) etch is self-limited (e.g., acting as an etch stop layer) during the dummy sheet (dummy layer) removal process, and (viii) reduced risk of leakage from gate-to-S/D and/or gate-to-MD with less inner spacer loss and S/D epi damage during dummy layer removal. Other embodiments and advantages will be evident to those skilled in the art upon reading the present disclosure.

For purposes of the discussion that follows, FIG. 1 provides a simplified top-down layout view of a multi-gate device 100. In various embodiments, the multi-gate device 100 may include a FinFET device, a GAA transistor, or other type of multi-gate device. The multi-gate device 100 may include a plurality of fin elements 104 extending from a substrate, a gate structure 108 disposed over and around the fin elements 104, and source/drain regions 105, 107, where the source/drain regions 105, 107 are formed in, on, and/or surrounding the fins 104. A channel region of the multi-gate device 100, which may include a plurality of semiconductor channel layers (e.g., when the multi-gate device 100 includes a GAA transistor), is disposed within the fins 104, underlying the gate structure 108, along a plane substantially parallel to a plane defined by section AA' of FIG. 1. In some embodiments, sidewall spacers may also be formed on sidewalls of the gate structure 108. Various other features of the multi-gate device 100 are discussed in more detail below with reference to the method of FIG. 2.

Figure 2:
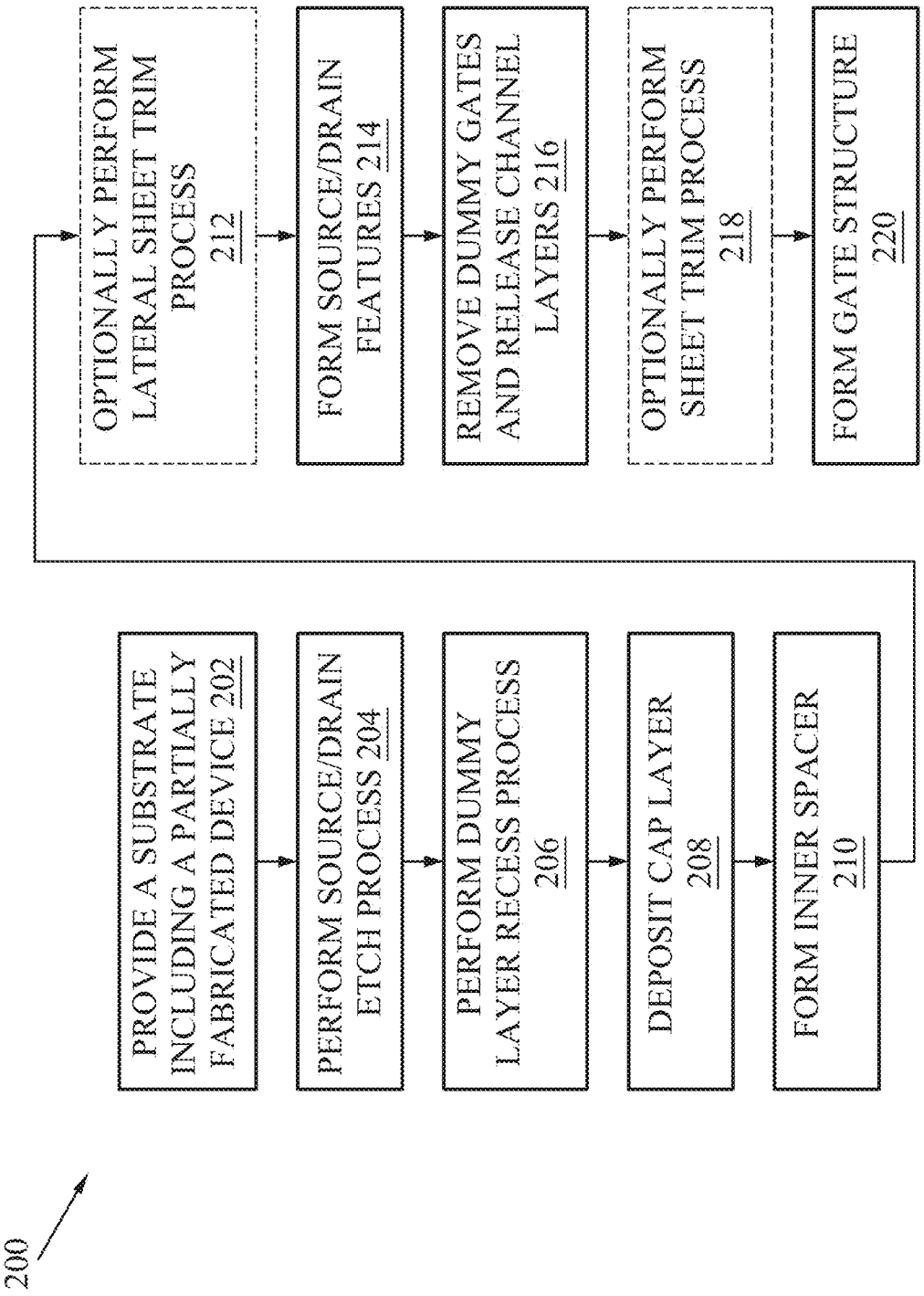
FIG. 2 is a flow chart of a method of fabricating a semiconductor device 300 according to one or more aspects of the present disclosure.

Referring to FIG. 2, illustrated therein is a method 200 of semiconductor fabrication including fabrication of a semiconductor device 300 (e.g., which includes a multi-gate device), in accordance with various embodiments. The method 200 is discussed below with reference to fabrication of GAA transistors. However, it will be understood that aspects of the method 200 may be equally applied to other types of multi-gate devices, or to other types of devices implemented by the multi-gate devices, without departing from the scope of the present disclosure. In some embodiments, the method 200 may be used to fabricate the multi-gate device 100, described above with reference to FIG. 1. Thus, one or more aspects discussed above with reference to the multi-gate device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

It is further noted that, in some embodiments, the semiconductor device 300 may include various other devices and features, such as other types of devices such as additional transistors, bipolar junction transistors, resistors, capacitors, inductors, diodes, fuses and/or other logic circuits, etc., but is simplified for a better understanding of the inventive concepts of the present disclosure. In some embodiments, the semiconductor device 300 include a plurality of semiconductor devices (e.g., transistors) which may be interconnected. Moreover, it is noted that the process steps of method 200, including any descriptions given with reference to the figures are merely exemplary and are not intended to be limiting beyond what is specifically recited in the claims that follow.

The method 200 begins at block 202 where a substrate including a partially fabricated device is provided. Referring to the example of FIG. 3, in an embodiment of block 202, a partially fabricated device 300 is provided. FIGS. 3-9, 10A/10B/10C, 11A/11B/11C, and 12 provide cross-sectional views of an embodiment of the semiconductor device 300 along a plane substantially parallel to a plane defined by section AA' of FIG. 1 (e.g., along the direction of a fin 306). The device 300 may be formed on a substrate 304. In some embodiments, the substrate 304 may be a semiconductor substrate such as a silicon substrate. The substrate 304 may include various layers, including conductive or insulating layers formed on a semiconductor substrate. The substrate 304 may include various doping configurations depending on design requirements as is known in the art. The substrate 304 may also include other semiconductors such as germanium, silicon carbide (SiC), silicon germanium (SiGe), or diamond. Alternatively, the substrate 304 may include a compound semiconductor and/or an alloy semiconductor. Further, the substrate 304 may optionally include an epitaxial layer (epi-layer), may be strained for performance enhancement, may include a silicon-on-insulator (SOI) structure, and/or have other suitable enhancement features.

Figure 3:
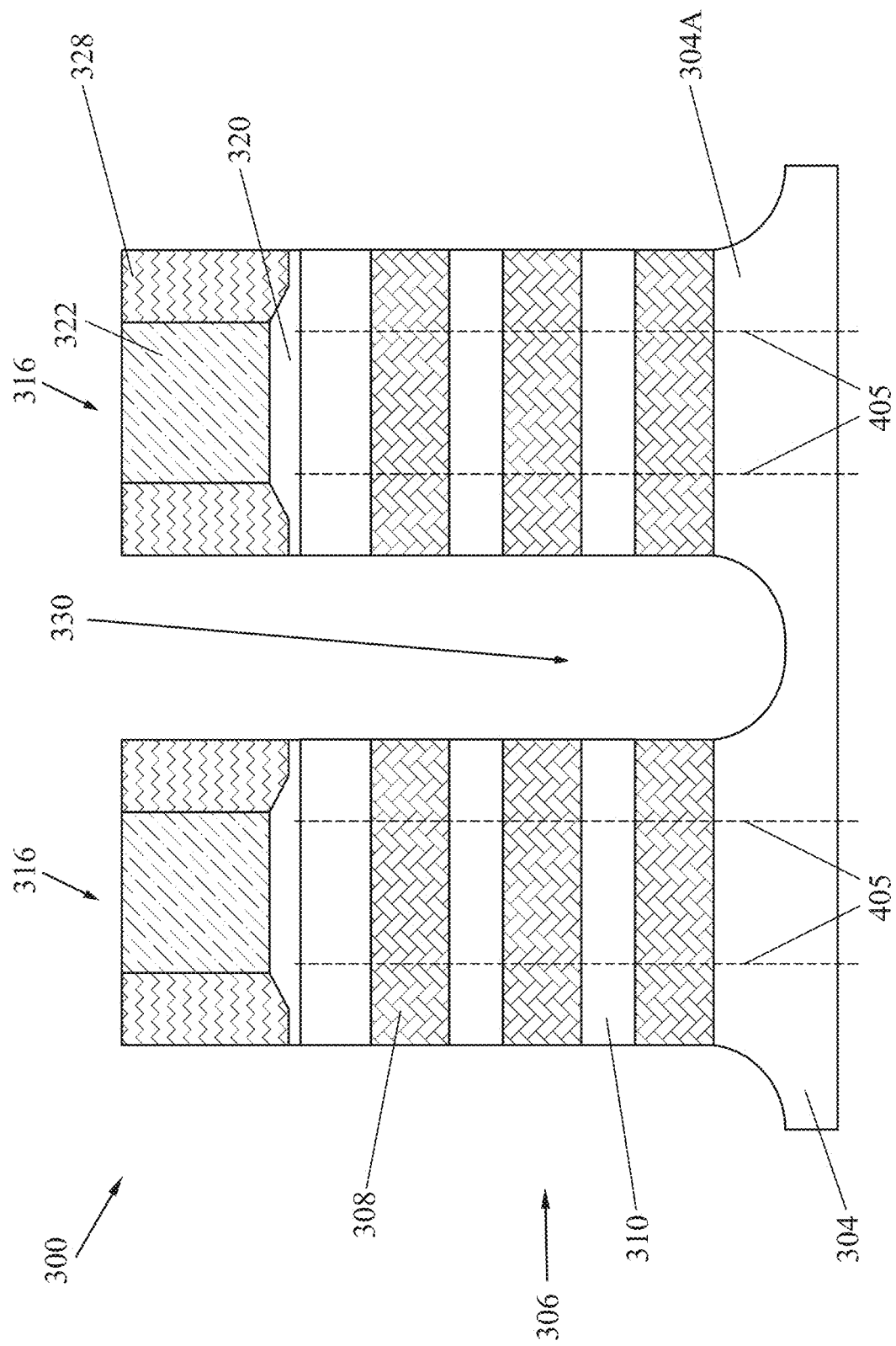
FIGS. 3, 4, 5, 6, 7, 8, 9, 10A, 10B, 10C, 11A, 11B, 11C, and 12 provide cross-sectional views of an embodiment of the semiconductor device 300 along a plane substantially parallel to a plane defined by section AA' of FIG. 1, in accordance with some embodiments.

As shown in FIG. 3, the device 300 includes the fin 306 having a substrate portion 304A (formed from the substrate 304), epitaxial layers 308 of a first composition and epitaxial layers 310 of a second composition that interpose the layers 308 of the first composition. In some cases, shallow trench isolation (STI) features may be formed to isolate the fin 306 from neighboring fins. For purposes of this discussion, the epitaxial layers 308 of the first composition include the above-mentioned dummy layers, and the epitaxial layers 310 of the second composition include the above-mentioned semiconductor channel layers. In an embodiment, the epitaxial layers 308 of the first composition include SiGe and the epitaxial layers of the second composition 310 include silicon (Si). It is also noted that while the layers 308, 310 are shown as having a particular stacking sequence within the fin 306, where the layer 310 is the topmost layer of the stack of layers 308, 310, other configurations are possible. For example, in some cases, the layer 308 may alternatively be the topmost layer of the stack of layers 308, 310. Stated another way, the order of growth for the layers 308, 310, and thus their stacking sequence, may be switched or otherwise be different than what is shown in the figures, while remaining within the scope of the present disclosure.

In various embodiments, the epitaxial layers 310 (e.g., including the second composition), or portions thereof, may form a channel region of a GAA transistor of the device 300. For example, as noted above, the layers 310 may be referred to as semiconductor channel layers that are used to form a channel region of a GAA transistor. In various embodiments, the semiconductor channel layers (e.g., the layers 310 or portions thereof) may include nanosheet channel(s), nanowire channel(s), bar-shaped channel(s), and/or other suitable channel configurations. The semiconductor channel layers may also be used to form portions of the source/drain features of the GAA transistor, in some embodiments.

It is noted that while the fin 306 is illustrated as including three (3) layers of the epitaxial layer 308 and three (3) layers of the epitaxial layer 310, this is for illustrative purposes only and not intended to be limiting beyond what is specifically recited in the claims. It can be appreciated that any number of epitaxial layers can be formed, where for example, the number of epitaxial layers depends on the desired number of semiconductor channel layers for the GAA transistor. In some embodiments, the number of epitaxial layers 310, and thus the number of semiconductor channel layers, is between 3 and 10.

In some embodiments, the epitaxial layers 308 (the dummy layers) each have a thickness in a range of about 5-15 nanometers (nm). In some cases, the epitaxial layers 310 (the semiconductor channel layers) each have a thickness in a range of about 5-15 nm. As noted above, the epitaxial layers 310 may serve as channel region(s) for a subsequently-formed multi-gate device (e.g., a GAA transistor) and its thickness may be chosen based at least in part on device performance considerations. The epitaxial layers 308 may serve to define a gap distance between adjacent channel region(s) for the subsequently-formed multi-gate device and its thickness may also be chosen based at least in part on device performance considerations. In some embodiments, the thickness of the epitaxial layers 310 (the semiconductor channel layers) may be less than the thickness of the epitaxial layers 308 (the dummy layers). In some examples, a ratio of thicknesses between a semiconductor channel layer (epitaxial layer 310) and a dummy layer (epitaxial layer 308) may be in a range of about ½ to about ⅕. Generally, and in various cases, the dummy layer (epitaxial layer 308) may be at least twice as thick as the semiconductor channel layer (epitaxial layer 310). Thus, embodiments of the present disclosure provide for a notably thicker dummy layer as compared to the semiconductor channel layer. As a result, the thicker dummy layers help to facilitate removal of the dummy layers at RPG and improves metal gate gap fill or multi work-function metal patterning.

The device 300 further includes gate stacks 316 formed over the fin 306. In an embodiment, the gate stacks 316 are dummy (sacrificial) gate stacks that are subsequently removed and replaced by a final gate stack at a subsequent processing stage of the device 300. For example, the gate stacks 316 may be replaced at a later processing stage by a high-K dielectric layer (HK) and metal gate electrode (MG). While the present discussion is directed to a replacement gate (gate-last) process whereby a dummy gate structure is formed and subsequently replaced, other configurations may be possible (e.g., such as a gate-first process). The portion of the fin 306 underlying the gate stacks 316 may be referred to as the channel region of the device 300. The gate stacks 316 may also define a source/drain region of the fin 306, for example, the regions of the fin 306 adjacent to and on opposing sides of the channel region.

In some embodiments, the gate stacks 316 include a dielectric layer 320 and an electrode layer 322. In some cases, one or more hard mask layers (e.g., including an oxide layer and/or a nitride layer) may be formed over the gate stacks 316. In some embodiments, the dielectric layer 320 includes silicon oxide. Alternatively, or additionally, the dielectric layer 320 may include silicon nitride, a high-K dielectric material or other suitable material. In some embodiments, the electrode layer 322 may include polycrystalline silicon (polysilicon). In some examples, an optional sacrificial layer may be formed directly beneath the dielectric layer 320. The optional sacrificial layer may include SiGe, Ge, or other appropriate material, and may be used in some cases to prevent nanosheet loss (e.g., such as loss of material from the epitaxial layers 308, 310) during previous processing steps.

In some embodiments, one or more spacer layers 328 may be formed on sidewalls of the gate stacks 316. In some cases, the one or more spacer layers 328 may include a dielectric material such as silicon oxide, silicon nitride, silicon carbide, silicon oxynitride, SiCN, silicon oxycarbide, SiOCN, a low-K material (e.g., with a dielectric constant 'k' <7), and/or combinations thereof. In some embodiments, the one or more spacer layers 328 includes multiple layers, such as main spacer layers, liner layers, and the like. It is noted that, in various embodiments, portions of the epitaxial layers 310 (the semiconductor channel layers) disposed beneath the one or more spacer layers 328 may be defined as the LDD region of the device 300. As shown in the figures, boundaries of the channel region of the device 300, adjacent to the LDD region, are schematically illustrated by dashed lines 405.

The method 200 then proceeds to block 204 where a source/drain etch process is performed. Still with reference to FIG. 3, in an embodiment of block 204, a source/drain etch process is performed to the device 300. In some embodiments, the source/drain etch process is performed to remove the exposed epitaxial layers 308, 310 in source/drain regions of the device 300 to form trenches 330 which expose underlying portions of the substrate 304. The source/drain etch process also serves to expose lateral surfaces of the epitaxial layers 308, 310, as shown in FIG. 3. In some embodiments, the source/drain etch process may also remove portions of the one or more spacer layers 328 (e.g., from top surfaces of the gate stacks 316). In some embodiments, the source/drain etch process may include a dry etching process, a wet etching process, and/or a combination thereof.

Figure 4:
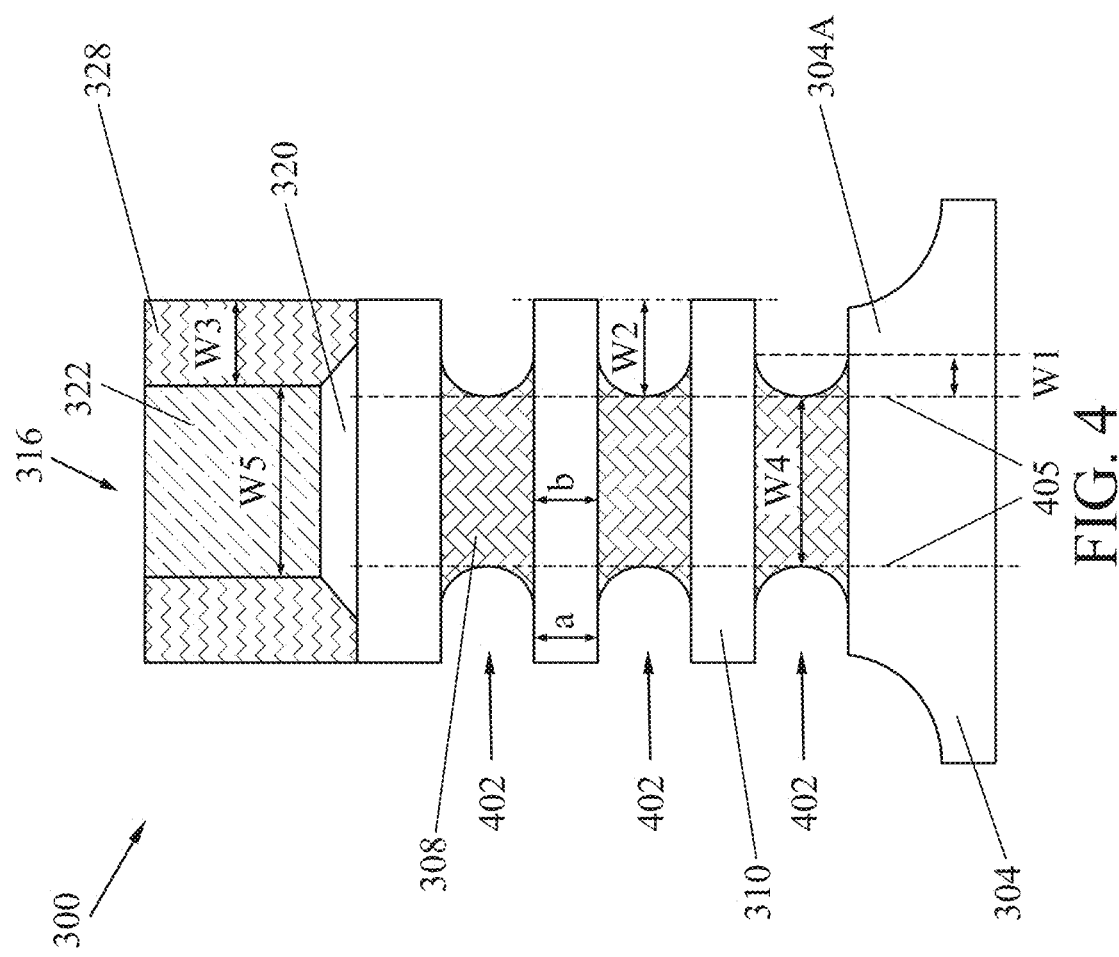

The method 200 then proceeds to block 206 where a dummy layer recess process is performed. Referring to FIG. 3 and FIG. 4, in an embodiment of block 206, a dummy layer recess process is performed to the device 300. The dummy layer recess process includes a lateral etch of the epitaxial layers 308 (the dummy layers) to form recesses 402 along sidewalls of the previously formed trenches 330. In some embodiments, the dummy layer recess process is performed using a dry etching process, a wet etching process, and/or a combination thereof. In some cases, the dummy layer recess process may include etching using a standard clean 1 (SC-1) solution, ozone ($O_3$), a solution of ammonium hydroxide ($NH_4OH$), hydrogen peroxide ($H_2O_2$) and water ($H_2O$), hydrofluoric acid (HF), buffered HF, and/or a fluorine ($F_2$)-based etch. In some examples, the $F_2$-based etch may include an $F_2$ remote plasma etch. As a result of the dummy layer recess process, the recessed epitaxial layers 308 (the dummy layers) define concave profiles along opposing lateral surfaces of the epitaxial layers 308. In some embodiments, the concave profile spans a width 'W1' of between about 0.5-2 nm. Stated another way, the size/shape of the recesses 402 is at least partially defined by the concave profiles of the sidewall surfaces of the epitaxial layers 308 having the width 'W1'. In some cases, a width 'W2' of an entirety of the recesses 402 may be substantially equal to a width 'W3' of the one or more spacer layers 328. Further, in some examples, a width 'W4' defined between concave profiles on opposing lateral surfaces of the epitaxial layers 308 may be substantially equal to a width 'W5' of the electrode layer 322 of the gate stack 316. In some embodiments, the width 'W4' is equivalent to the gate length of the device 300 and is defined as the distance between the boundaries of the channel region, schematically illustrated by dashed lines 405. During a later stage of processing, as discussed below, the epitaxial layers 308 (the dummy layers) will be removed and replaced by a portion of a gate structure (e.g., a metal gate structure) such that the replacement gate structure at least partially defines the concave profile. In various examples, the replacement gate structure will interface an inner spacer, as also described in more detail below.

As shown in FIG. 4, the epitaxial layers 310 (the semiconductor channel layers) have a thickness 'a' in the LDD region (e.g., underlying the spacer 328) and a thickness 'b' within the channel region (e.g., underlying the gate stacks 316). Prior to the dummy layer recess process, and in some embodiments, the thickness 'a' may be substantially equal to the thickness 'b'. In some cases, and as a result of the dummy layer recess process, ends of the epitaxial layers 310 in the LDD region of the device 300 may be partially etched such that the epitaxial layers 310 may be slightly thinner in the LDD region as compared to the channel region. Stated another way, after the dummy layer recess process, the thickness 'a' may be less than the thickness 'b'. By way of example, the consumption from each of the top and bottom surfaces of the epitaxial layers 310 in the LDD region, as a result of the dummy layer recess process, may be in a range of about 0.5-1 nm, for a total consumption from both top and bottom surfaces of the epitaxial layers 310 of about 1-2 nm. To be sure, in some embodiments, ends of the epitaxial layers 310 in the LDD region may not be etched during the dummy layer recess process such that the thickness 'a' remains substantially equal to the thickness 'b' after the dummy layer recess process. More generally, in various embodiments and after the dummy layer recess process, the thickness 'a' may be less than or equal to the thickness 'b'.

Figure 5:
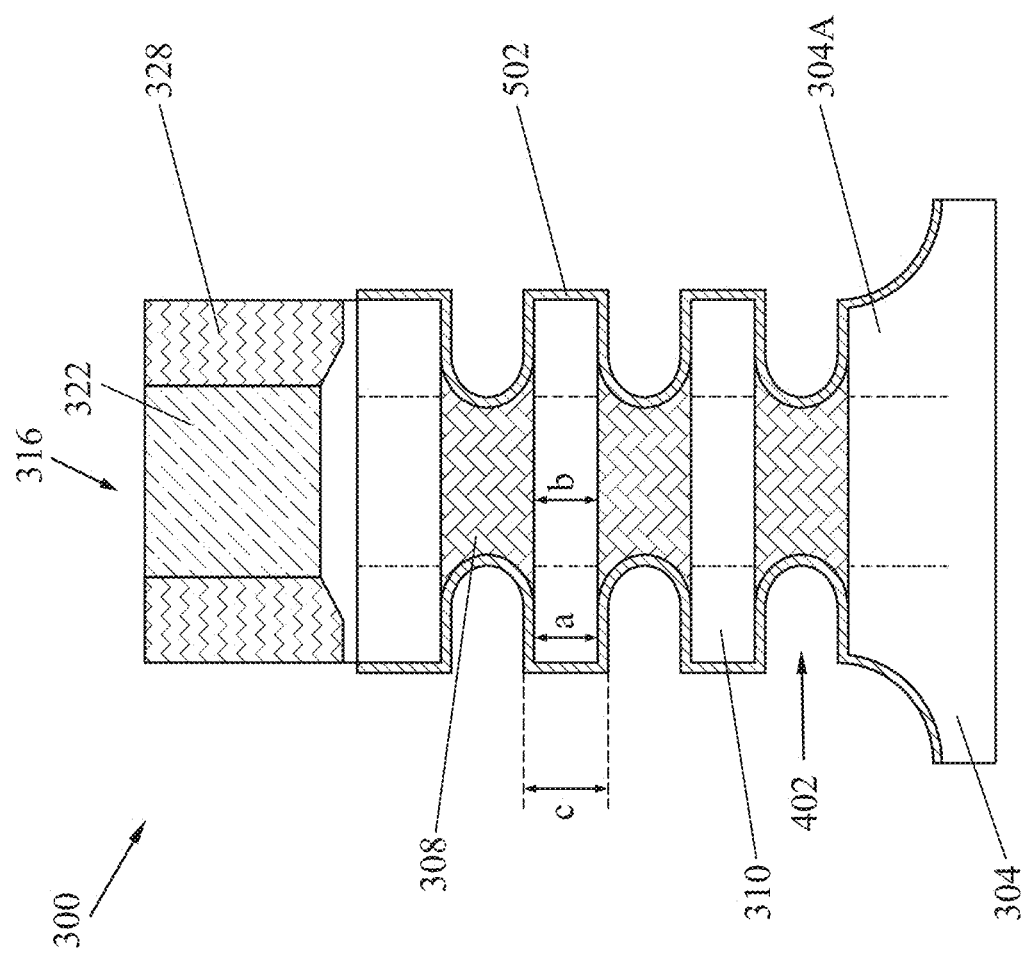

The method 200 then proceeds to block 208 where a cap layer is deposited. Referring to FIG. 4 and FIG. 5, in an embodiment of block 208, a cap layer 502 may be conformally deposited along exposed lateral surfaces of the epitaxial layers 310 (semiconductor channel layer) and within the recesses 402, including on exposed top and/or bottom surfaces of the epitaxial layers 310 and on the concave profiles of the sidewall surfaces of the epitaxial layers 308 (the dummy layers). As shown, the cap layer 502 may also be conformally deposited on exposed surfaces of the substrate portion 304A, which may include a bottom surface of the trenches 330. In some cases, the cap layer 502 may be selectively formed on surfaces of the epitaxial layers 308, 310, as described above. Alternatively, in some embodiments, the cap layer 502 may be blanket deposited over the device 300 and within the trenches 330 and the recesses 402, followed by an etch-back process that removes the cap layer 502 from top surfaces of the gate stacks 316 and top/side surfaces of the one or more spacer layers 328, while the cap layer 502 remains on surfaces of the epitaxial layers 308, 310, as described above.

In some embodiments, the cap layer 502 may include a silicon (Si) layer. More generally, and in some cases, the cap layer 502 may include a material composition that is substantially the same as the material composition of the epitaxial layers 310 (semiconductor channel layer). To be sure, in some examples, the cap layer 502 may include a material composition that is different than the material composition of the epitaxial layers 310 (semiconductor channel layer). Generally, in some cases, the cap layer 502 may contribute to current flow between source/drain features of the device 300. In various examples, the cap layer 502 may have a thickness in a range of about 0.5-1.5 nm. In some embodiments, the cap layer 502 may have a thickness that is less than or equal to the consumption of the epitaxial layers 310 in the LDD region (e.g., as a result of the dummy layer recess process), as described above. The cap layer 502 may thus, in some respects, compensate for the consumption of the epitaxial layers 310 in the LDD region. By way of example, and after deposition of the cap layer 502, a thickness 'c' in the LDD region (e.g., underlying the spacer 328) is equal to the thickness 'a'+the cap layer 502 thickness on top and/or bottom surfaces of the epitaxial layers 310, where the thickness 'c' may be less than or equal to the thickness 'b' within the channel region. Thus, for the topmost epitaxial layer 310, which only has the cap layer 502 disposed on lateral and bottom surfaces of the epitaxial layer 310, the thickness 'c' is equal to the thickness 'a'+(1×the cap layer thickness 502). For other epitaxial layers 310 which have the cap layer 502 disposed on lateral, top, and bottom surfaces of the epitaxial layer 310, the thickness 'c' is equal to the thickness 'a'+(2×the cap layer thickness 502). In various embodiments, the cap layer 502 may help to prevent inner spacer and S/D damage during the dummy layer removal process. In addition, the cap layer 502 may form a part of the semiconductor channel layer, thereby effectively providing a thicker semiconductor channel layer in the LDD region, thus helping to provide the H-shaped (or dog-bone shaped) semiconductor channel layer.

Figure 6:
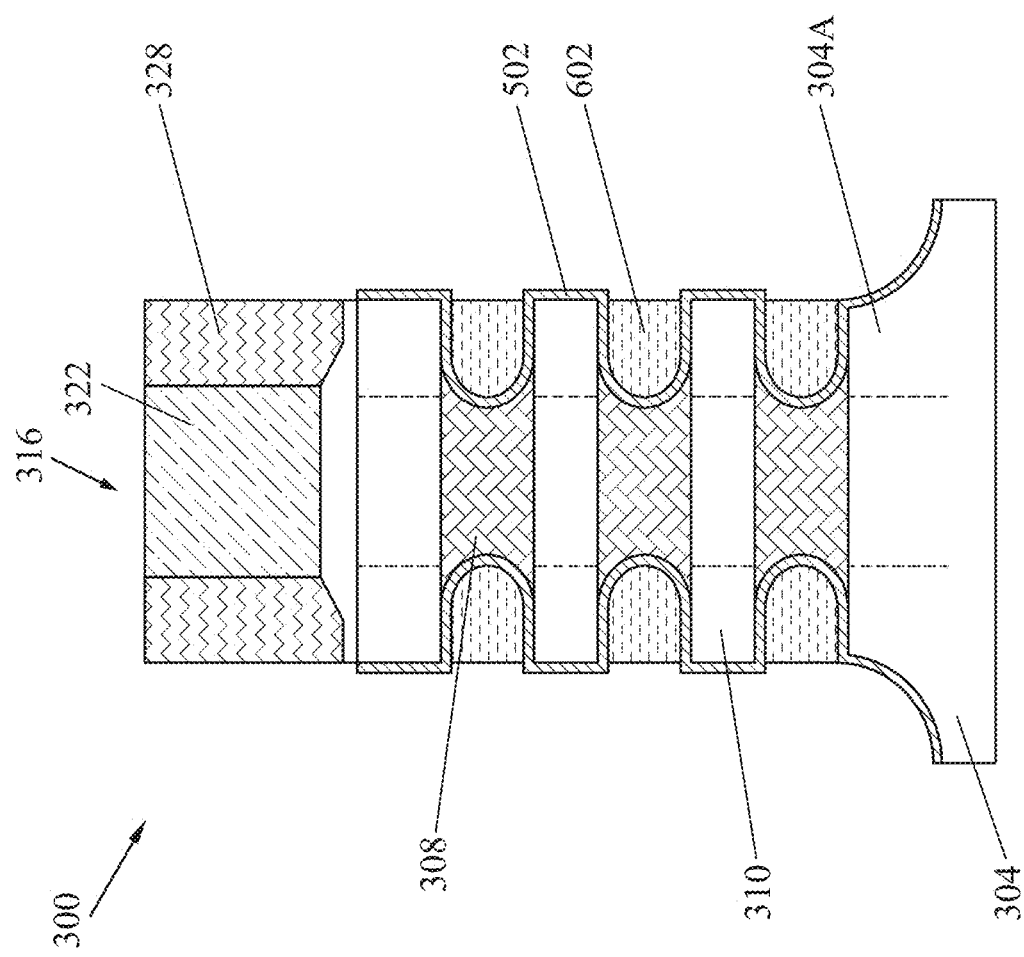

The method 200 then proceeds to block 210 where an inner spacer is formed. Referring to FIG. 5 and FIG. 6, in an embodiment of block 210, an inner spacer material is initially deposited over the device 300, within the trenches 330 and within the recesses 402. In particular, the inner spacer material is deposited over the previously deposited cap layer 502 (block 208). In some cases, the inner spacer material may have a thickness of about 4-15 nm. In some embodiments, the inner spacer material may include amorphous silicon. In some examples, the inner spacer material may include a dielectric material such as silicon oxide, silicon nitride, silicon carbide, silicon oxynitride, SiCN, silicon oxycarbide, SiOCN, a low-K material (e.g., with a dielectric constant 'k' <7), and/or combinations thereof. By way of example, the inner spacer material may be formed by conformally depositing the inner spacer material over the device 300 using processes such as a CVD process, a subatmospheric CVD (SACVD) process, a flowable CVD process, an ALD process, a PVD process, or other suitable process.

After deposition of the inner spacer material, an inner spacer etch-back process may be performed. In various examples, the inner spacer etch-back process etches the inner spacer material from over the device 300 and along sidewalls of the trenches 330 (exposing the underlying cap layer 502 on the lateral surfaces of the semiconductor channel layers), while the inner spacer material remains disposed within the recesses 402 (on top of the underlying cap layer 502), thereby providing inner spacers 602 for the device 300. By way of example, the inner spacer etch-back process may be performed using a wet etch process, a dry etch process, or a combination thereof. In some cases, any residual portions of the inner spacer material that remain on top surfaces of the device 300 and/or on sidewalls or bottom surfaces of the trenches 330, for example after the inner spacer etch-back process, may be removed during subsequent processes (e.g., prior to epitaxial growth of source/drain features). In various examples, the inner spacers 602 may extend beneath the one or more spacer layers 328 (formed on sidewalls of the gate stacks 316) while being disposed adjacent to subsequently formed source/drain features, as described below. In some cases, the inner spacers 602 may extend at least partially beneath the gate stacks 316.

Figure 7:
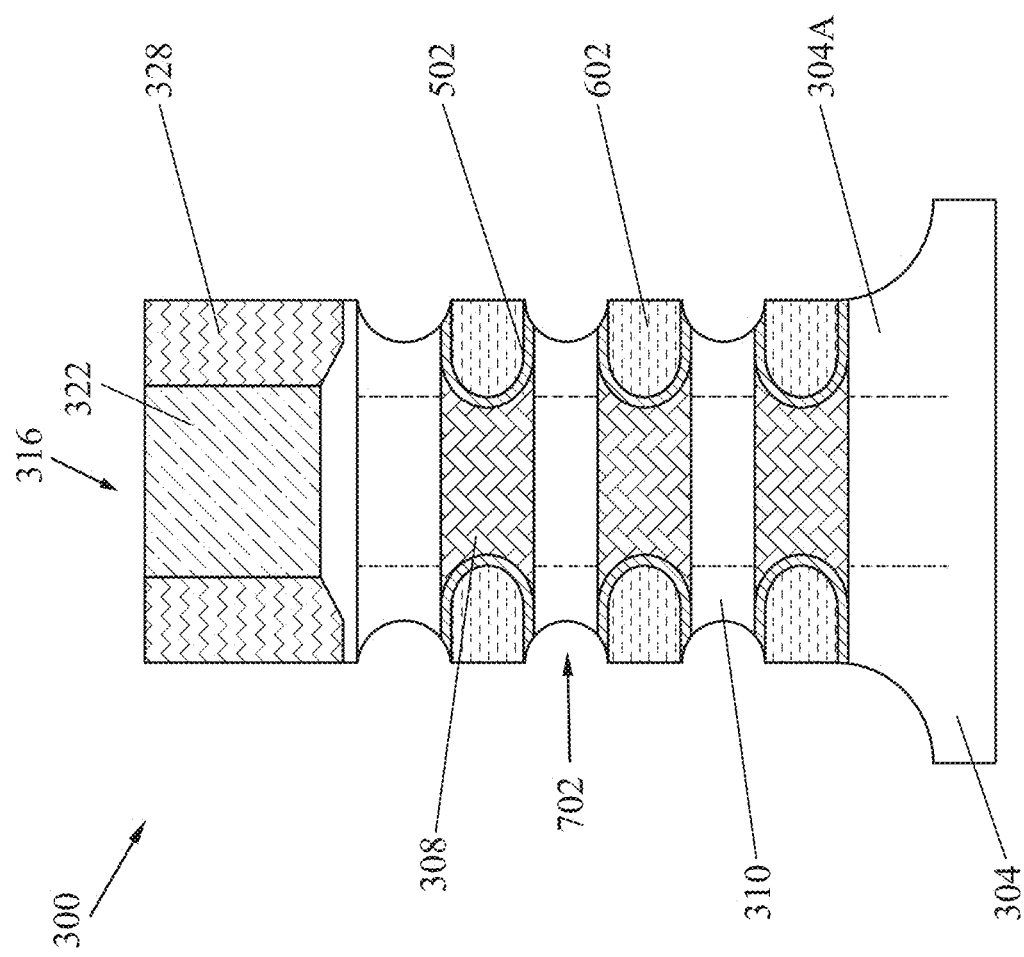

The method 200 then proceeds to block 212 where a lateral sheet trim process is optionally performed. Referring to FIG. 6 and FIG. 7, in an embodiment of block 212, a lateral sheet trim process may optionally be performed after forming the inner spacers 602 (block 210) and prior to forming epitaxial source/drain features (block 214). In some embodiments, the optional lateral sheet trim process of block 212 includes a lateral etch of the cap layer 502 disposed on lateral surfaces of the epitaxial layers 310 (semiconductor channel layers), as well as a lateral etch of the epitaxial layers 310, to form recesses 702 along sidewalls of the previously formed trenches 330. In some embodiments, the lateral sheet trim process is performed using a dry etching process, a wet etching process, and/or a combination thereof. In some cases, the lateral sheet trim process may include etching using a standard clean 1 (SC-1) solution, ozone ($O_3$), a solution of ammonium hydroxide ($NH_4OH$), hydrogen peroxide ($H_2O_2$) and water ($H_2O$), hydrofluoric acid (HF), buffered HF, and/or a fluorine ($F_2$)-based etch. In some examples, the $F_2$-based etch may include an $F_2$ remote plasma etch. As a result of the lateral sheet trim process, the recessed epitaxial layers 310 (the semiconductor channel layers) define concave profiles along opposing lateral surfaces of the epitaxial layers 310. In embodiments where the cap layer 502 includes a material composition that is substantially the same as the material composition of the epitaxial layers 310, then the lateral sheet trim process may be performed using a single etch process that etches both the cap layer 502 and the epitaxial layers 310. In embodiments where the cap layer 502 includes a material composition that is different than the material composition of the epitaxial layers 310, then the lateral sheet trim process may be performed using multiple etch processes (which may be different etch processes) to etch each of the cap layer 502 and the epitaxial layers 310. During subsequent processing, source/drain features formed in source/drain regions on either side of the gate stacks 316 may be formed in contact with the recessed epitaxial layers 310 (semiconductor channel layers). As a result of the optional lateral sheet trim process, a distance between the subsequently formed source drain features and the channel region of the epitaxial layers 310 (e.g., underlying the gate stacks 316) is reduced, thereby enhancing device performance. Thus, in some cases, the optional lateral sheet trim process of block 212 may be referred to as a junction push process.

Figure 8:
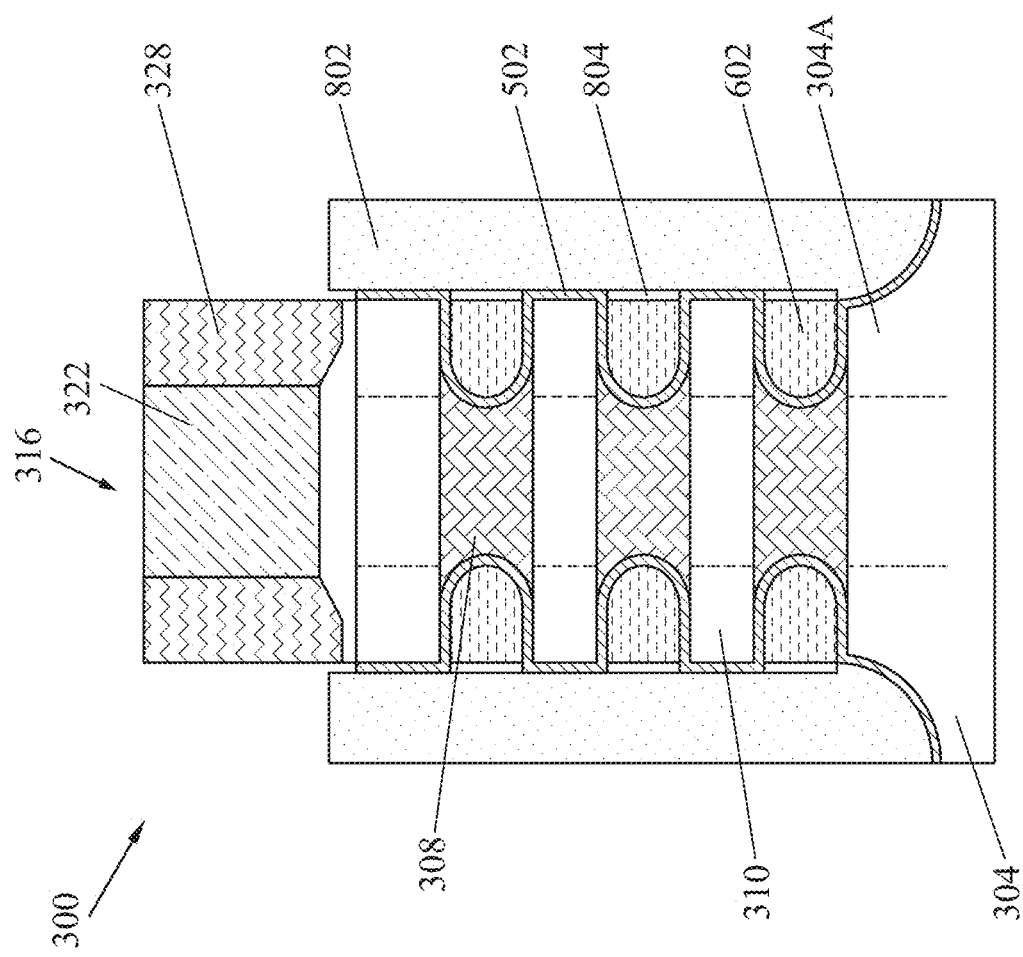

For purposes of the discussion that follows, it is assumed that the optional lateral sheet trim process of block 212 is not performed. If the optional lateral sheet trim process is not performed, then the method 200 may proceed from block 210 (inner spacer formation) to block 214 where source/drain features are formed. Referring to FIG. 6 and FIG. 8, in an embodiment of block 214, source/drain features 802 are formed. In some embodiments, the source/drain features 802 are formed in source/drain regions adjacent to and on either side of the gate stacks 316 of the device 300. For example, the source/drain features 802 may be formed within the trenches 330 of the device 300, over the exposed portions of the substrate 304, in contact with the cap layer 502 disposed on lateral surfaces of the epitaxial layers 310 (semiconductor channel layers), and adjacent to (but not necessarily in contact with) the inner spacers 602. Stated another way, the source/drain features 802 may be selectively grown on exposed surfaces of the cap layer 502 or on exposed surfaces of the recessed epitaxial layers 310 (e.g., if the optional lateral sheet trim process of block 212 is performed). However, in some cases, the source/drain features 802 may not completely form along exposed surfaces of the inner spacers 602, which may result in voids 804 at a source/drain-inner spacer junction. The source/drain features 802 may not completely form on the inner spacers 602, in at least some examples, because the inner spacers 602 include a dielectric layer. In some embodiments, a clean process may be performed immediately prior to formation of the source/drain features 802. The clean process may include a wet etch, a dry etch, or a combination thereof. In addition, the clean process may remove any residual portions of the inner spacer material that remained on top surfaces of the device 300 and/or on sidewalls or bottom surfaces of the trenches 330 (e.g., after the inner spacer etch-back process).

In some embodiments, the source/drain features 802 are formed by epitaxially growing a semiconductor material layer in the source/drain regions. In various embodiments, the semiconductor material layer grown to form the source/drain features 802 may include Ge, Si, GaAs, AlGaAs, SiGe, GaAsP, SiP, or other suitable material. The source/drain features 802 may be formed by one or more epitaxial (cpi) processes. In some embodiments, the source/drain features 802 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 802 are not in-situ doped, and instead an implantation process is performed to dope the source/drain features 802.

After forming the source/drain features 802 (block 214), and in some embodiments, a contact etch stop layer (CESL) and an inter-layer dielectric (ILD) layer may be formed over the device 300. In some examples, the CESL may include a silicon nitride layer, silicon oxide layer, a silicon oxynitride layer, and/or other materials known in the art. In some cases, the ILD layer may include materials such as tetraethylorthosilicate (TEOS) oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials. In some embodiments, after formation of the ILD layer, the device 300 may be subject to a high thermal budget process to anneal the ILD layer. In some embodiments, after formation of the CESL and the ILD layer, a chemical mechanical polishing (CMP) process may be performed to remove portions of the ILD layer and the CESL overlying the gate stacks 316 to planarize a top surface of the device 300 and expose a top surface of the gate stacks 316 (e.g., including the gate electrode layer 322). In some embodiments, the CMP process may remove hard mask layers (if present) overlying the gate stacks 316 to expose the electrode layer 322.

The method 200 then proceeds to block 216 where dummy gates are removed, and a channel layer release process is performed. Referring to the example of FIG. 8 and FIG. 9, in an embodiment of block 216, the exposed electrode layer 322 of the gate stacks 316 may initially be removed by suitable etching processes, followed by an etching process to remove the dielectric layer 320 from the gate stacks 316. In some examples, the etching processes may include a wet etch, a dry etch, or a combination thereof.

After removal of the dummy gates, and in a further embodiment of block 216, the dummy layers (the epitaxial layers 308) in the channel region of the device 300 may be selectively removed (e.g., using a selective etching process), while the semiconductor channel layers (the epitaxial layers 310) remain unetched. To be sure, in at least some cases, removal of the dummy layers (the epitaxial layers 308) may partially etch top and/or bottom surfaces of the epitaxial layers 310 (semiconductor channel layers) within the channel region of the device 300, such that the semiconductor channel layers are slightly thinner in the channel region as compared to the LDD region. Consumption of the top and/or bottom surfaces of the epitaxial layers 310 by removal of the dummy layers, if such consumption occurs, may be in a range of about 1-4 nm. In some cases, consumption of portions of the epitaxial layers 310 during the selective etching process to remove the dummy layers may occur due to intermixing of the epitaxial layers 308/310 at an interface between the epitaxial layers 308 and the epitaxial layers 310.

In some examples, selective removal of the dummy layers may be referred to as a channel layer release process (e.g., as the semiconductor channel layers are released from the dummy layers). The selective etching process may be performed through a trench provided by the removal of the dummy gate electrode. In some embodiments, the selective etching process may include a selective wet etching process. In some cases, the selective wet etching includes ammonia and/or ozone. As merely one example, the selective wet etching process includes tetra-methyl ammonium hydroxide (TMAH). It is noted that as a result of the selective removal of the dummy layers (the epitaxial layers 308), gaps 902 may be formed between the adjacent semiconductor channel layers (the epitaxial layers 310) in the channel region. By way of example, the gaps 902 may serve to expose first portions of the epitaxial layers 310 between opposing concave profiles 904 of the cap layers 502 and inner spacers 602, while second portions of the epitaxial layers 310 remain covered by the cap layer 502 and inner spacers 602. As described in more detail below, portions of gate structures for the device 300 will be formed within the gaps 902.

Figure 9:
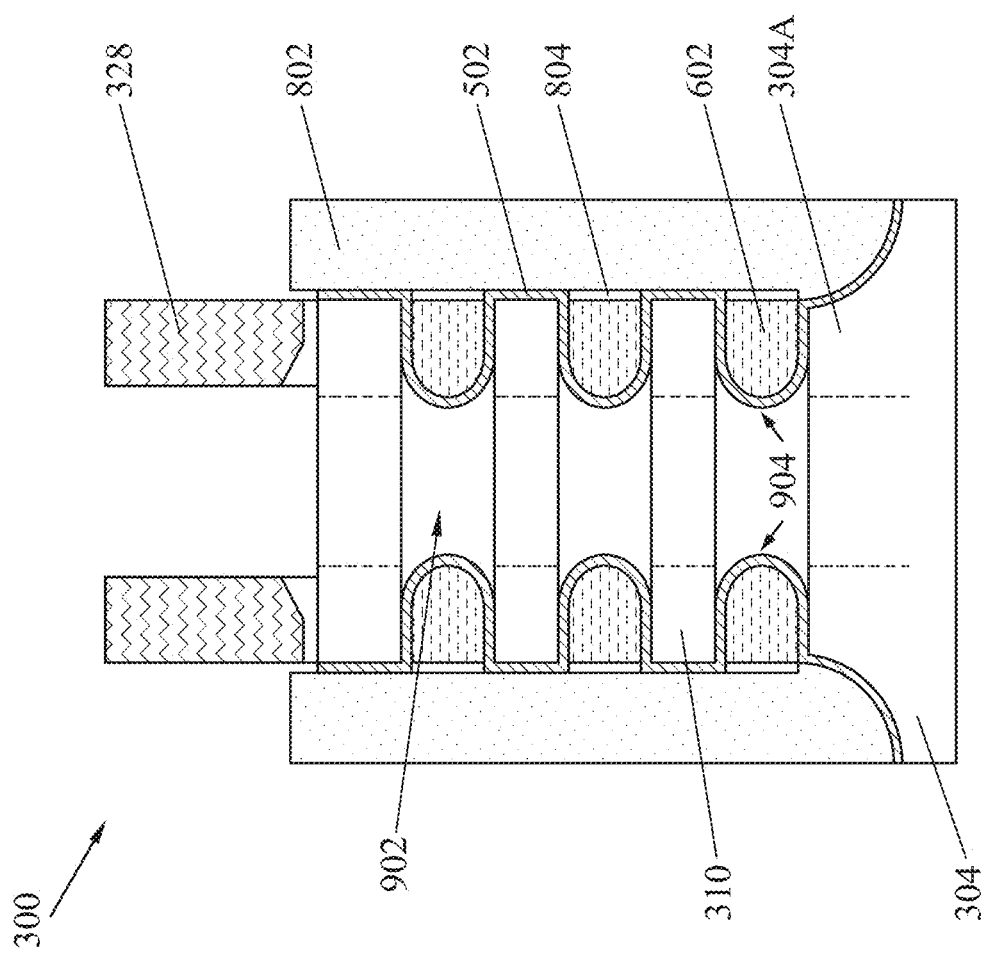
Figure 10A:
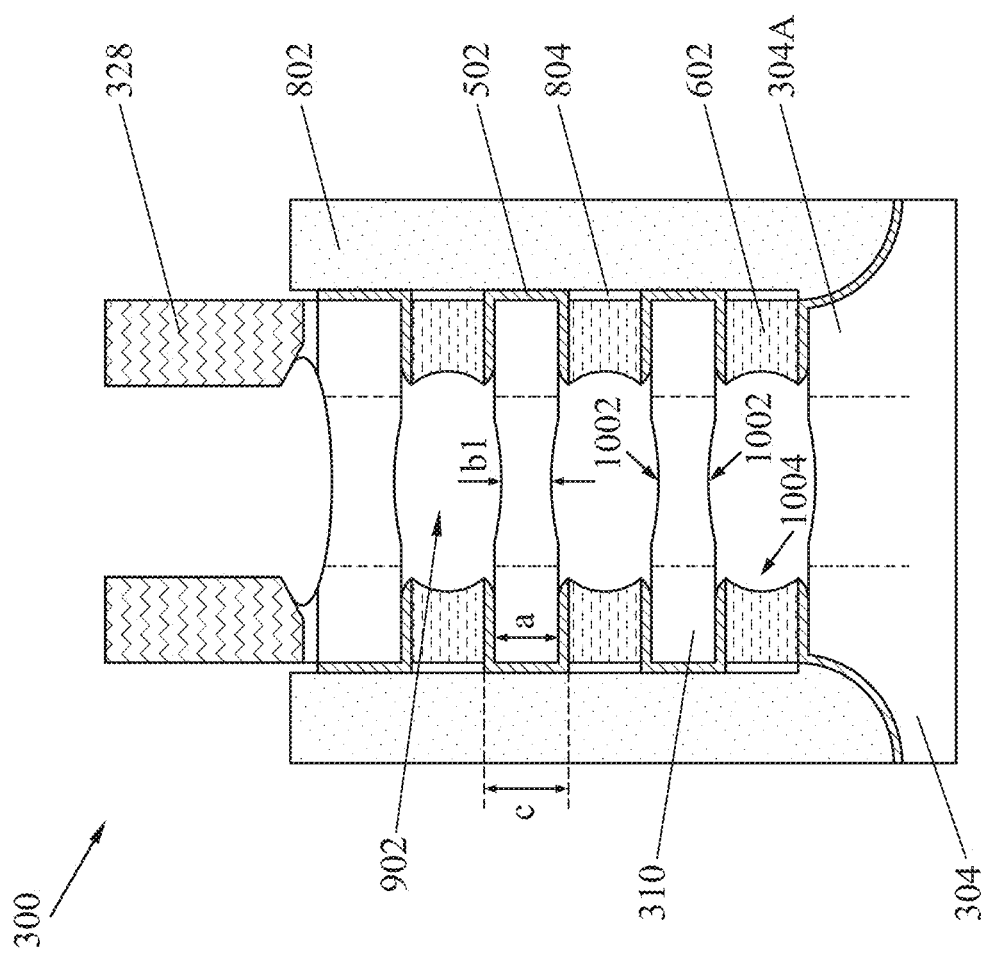

After selective removal of the dummy layers (the epitaxial layers 308), method 200 then proceeds to block 218 where a sheet trim process is optionally performed. Referring to FIG. 9 and FIGS. 10A/10B/10C, in an embodiment of block 218, a sheet trim process may optionally be performed after the channel layer release process (block 216) and prior to forming a gate structure (block 220). In some embodiments, the optional sheet trim process of block 218 includes an etch of exposed top and bottom surfaces of the epitaxial layers 310 (semiconductor channel layers) within the channel region of the device 300, such that the semiconductor channel layers are slightly thinner in the channel region as compared to the LDD region. Consumption of the top and bottom surfaces of the epitaxial layers 310 by a combination of removal of the dummy layers (as discussed above) and by the optional sheet trim process, if performed, may be in a range of about 1-4 nm. The consumption of the top and bottom surfaces of the epitaxial layers 310 is schematically shown in FIGS. 10A/10B/10C by slightly recessed top and bottom surfaces 1002 of the epitaxial layers 310. Due to the slight consumption of the top and bottom surfaces of the epitaxial layers 310, the epitaxial layers 310 now have a thickness 'b1' within the channel region (e.g., underlying the gate stacks 316), where the thickness 'b1' is less than the starting thickness 'b' of the epitaxial layers 310 within the channel region. It is noted that at this stage the thickness 'c' in the LDD region may be greater than the thickness 'b1' within the channel region, thereby helping to provide the H-shaped (or dog-bone shaped) semiconductor channel layer. In some embodiments, the sheet trim process is performed using a dry etching process, a wet etching process, and/or a combination thereof. In some cases, the sheet trim process may include etching using a standard clean 1 (SC-1) solution, ozone ($O_3$), a solution of ammonium hydroxide (NHOH), hydrogen peroxide ($H_2O_2$) and water ($H_2O$), hydrofluoric acid (HF), buffered HF, and/or a fluorine (F$_2$)-based etch. In some examples, the F$_2$-based etch may include an F$_2$ remote plasma etch.

Figure 10B:
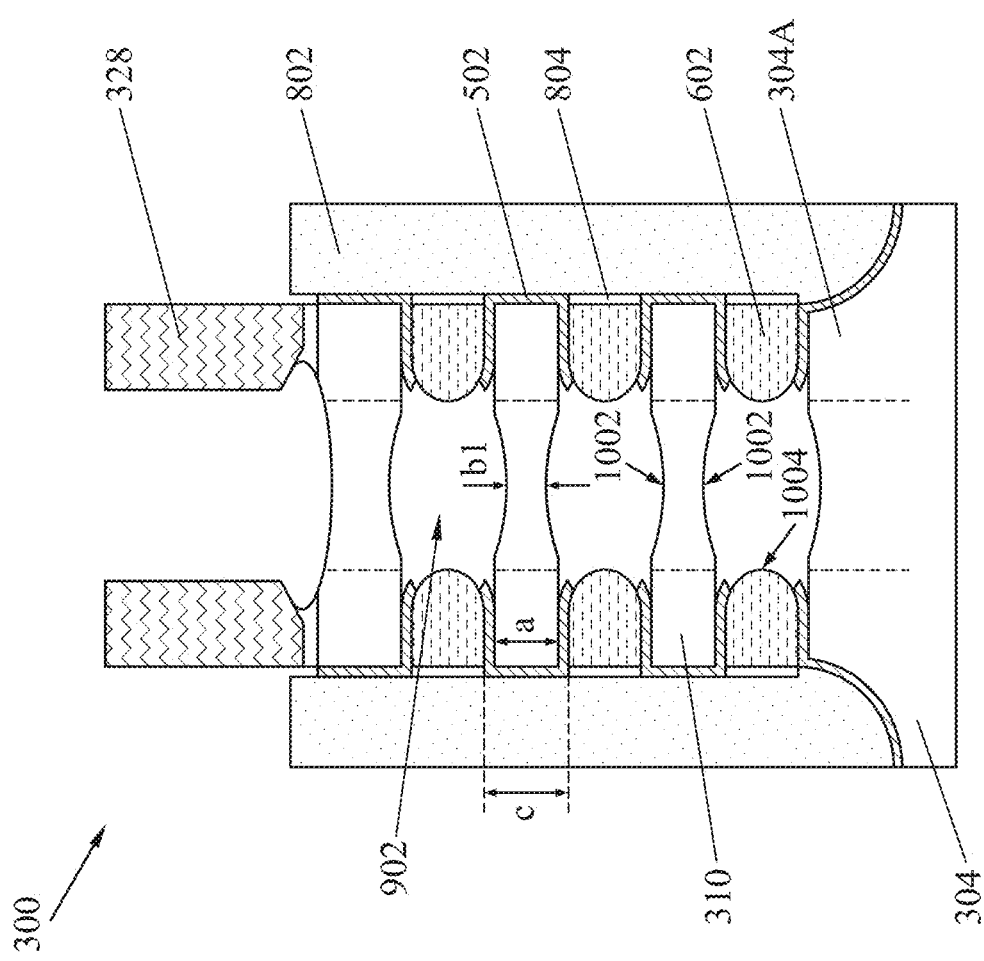
Figure 10C:
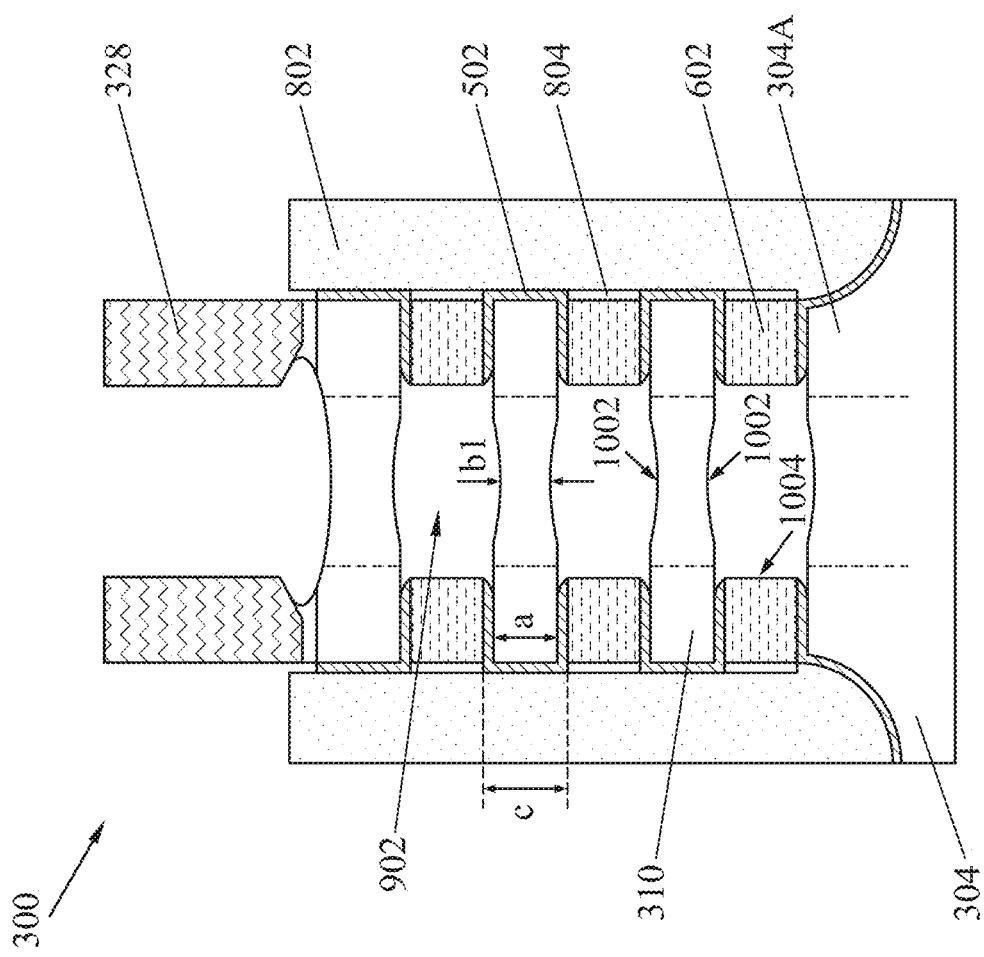

It is noted that in some embodiments, the optional sheet trim process of block 218 also etches exposed surfaces of the cap layers 502 along lateral sides of the gaps 902, and in some cases also optionally etches at least part of the underlying inner spacers 602, such that the optional sheet trim process exposes surfaces 1004 of the inner spacers 602. In various embodiments, and as a result of the optional sheet trim process, different amounts of the cap layers 502 along lateral sides of the gaps 902 may be etched, and different amounts of the underlying inner spacers 602 may be etched, resulting in different profiles of the exposed surfaces 1004, as discussed below. Generally, in various examples, the optional sheet trim process may result in the cap layers 502 being laterally recessed (e.g., along a plane parallel to the epitaxial layers 310) with respect to the inner spacers 602, the inner spacers 602 being laterally recessed (e.g., along the plane parallel to the epitaxial layers 310) with respect to the cap layers 502, or the cap layers 502 and the inner spacers 602 being laterally recessed by a substantially equal amount. By way of example, the sheet trim process of block 218 may result in the exposed surfaces 1004 having a concave profile as shown in FIG. 10A, a convex profile as shown in FIG. 10B, or a substantially flat (vertical) profile as shown in FIG. 10C. In some embodiments including the convex profile (e.g., such as FIG. 10B), only a center portion of the cap layers 502 along the lateral sides of the gaps 902 may be removed, such that only center portions of the underlying inner spacers 602 are exposed. As a result, and in some examples, the exposed center portions of the underlying inner spacers 602 may protrude into the gaps 902 beyond the cap layer 502 along the plane parallel to the epitaxial layers 310. In some embodiments including the concave profile (FIG. 10A) or flat (vertical) profile (FIG. 10C), the exposed portions of the underlying inner spacers 602 do not protrude into the gaps 902 beyond the cap layer 502 along the plane parallel to the epitaxial layers 310. In some embodiments, and depending on the type of profiles of the exposed surfaces, the slightly recessed top and bottom surfaces 1002 of the epitaxial layers 310 may be contained with the boundaries of the channel region of the device 300 or may extend beyond the boundaries of the channel region of the device 300. In various embodiments, and depending on the optional sheet trim process, the underlying inner spacers 602 alone, or a combination of the cap layers 502 and the inner spacers 602, provide the different profiles of the exposed surfaces 1004, as discussed above.

During subsequent processing, portions of a gate structure may be formed in the gaps 902, between adjacent epitaxial layers 310, such that the portions of the gate structure formed in the gaps 902 are in contact with the slightly recessed top and bottom surfaces 1002 of the epitaxial layers 310 (semiconductor channel layers) and the exposed surfaces 1004 of the inner spacers 602. In some embodiments, the optional sheet trim process of block 218 may be performed to remove intermixed layers (the epitaxial layers 308 and 310) at an interface between the epitaxial layers 308 and the epitaxial layers 310, thereby enhancing device performance. It is further noted that in various embodiments, the optional sheet trim process of block 218 may be skipped, in some examples, if the starting thickness 'b' of the epitaxial layers 310 is sufficiently thin (e.g., according to device performance requirements) and/or if there is substantially no intermixing of layers (the epitaxial layers 308 and 310) at the interface between the epitaxial layers 308 and the epitaxial layers 310. If the optional sheet trim process is skipped, and in some embodiments, the portions of the gate structure subsequently formed in the gaps 902 are in contact with the top and bottom surfaces of the epitaxial layers 310 (semiconductor channel layers) and with the exposed surfaces of the cap layers 502 along lateral sides of the gaps 902.

The method 200 proceeds to block 220 where a gate structure is formed. The gate structure may include a high-K/metal gate stack, however other compositions are possible. In some embodiments, the gate structure may form the gate associated with the multi-channels provided by the plurality of exposed semiconductor channel layers (the exposed epitaxial layers 310, now having gaps 902 therebetween) in the channel region of the device 300. With reference to the example of FIGS. 11A/11B/11C, in an embodiment of block 220, a gate dielectric 1102 is deposited on exposed surfaces of the epitaxial layers 310 (semiconductor channel layers), including on the exposed first portions of the epitaxial layers 310 within the gaps 902 and between opposing exposed surfaces 1004 of the inner spacers 602. In some embodiments, the gate dielectric 1102 has a total thickness of about 1-5 nm. In various embodiments, the gate dielectric 1102 includes an interfacial layer (IL) and a high-K dielectric layer formed over the IL. High-K gate dielectrics, as used and described herein, include dielectric materials having a high dielectric constant, for example, greater than that of thermal silicon oxide (~3.9).

In some embodiments, the IL may include a dielectric material such as silicon oxide ($SiO_2$), HfSiO, or silicon oxynitride (SiON). In some examples, the high-K dielectric layer may include hafnium oxide ($HfO_2$). Alternatively, the high-K dielectric layer may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. In various embodiments, the gate dielectric 1102 may be formed by thermal oxidation, ALD, physical vapor deposition (PVD), pulsed laser deposition (PLD), CVD, and/or other suitable methods.

Figure 11A:
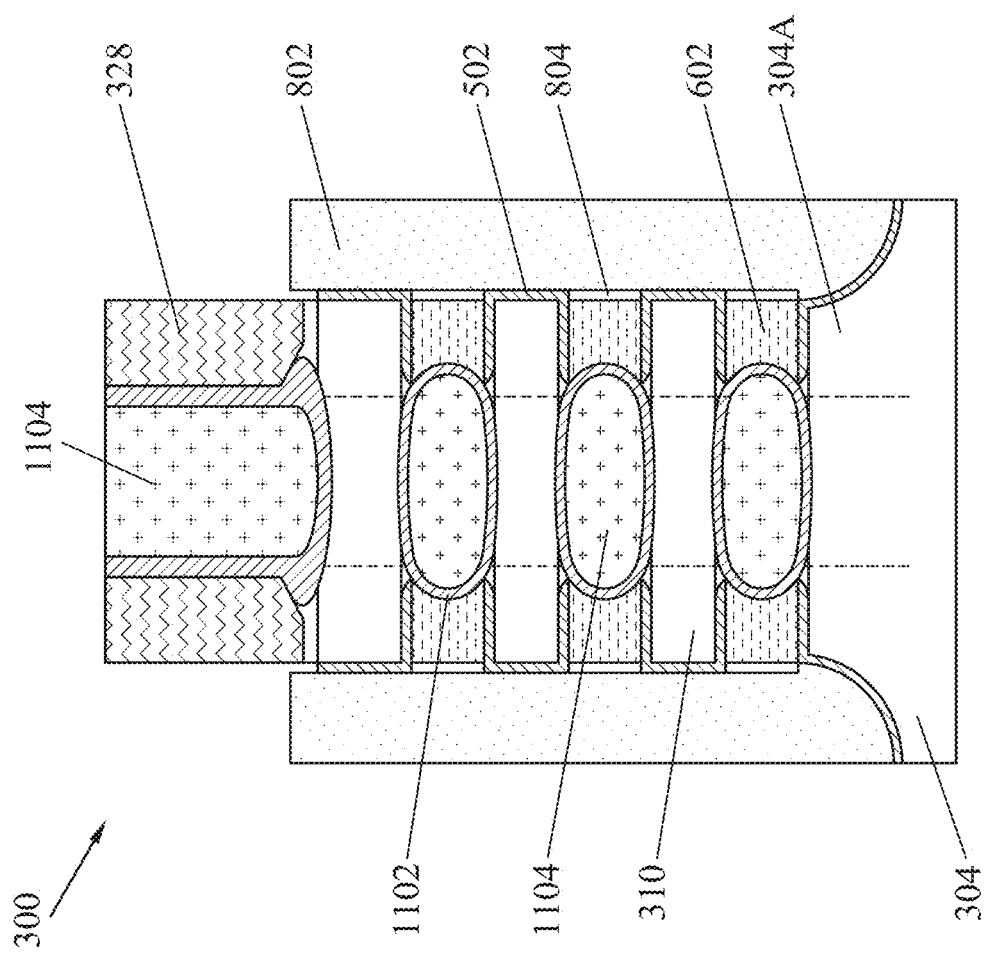

Still referring to the example of FIGS. 11A/11B/11C, and in a further embodiment of block 220, a metal gate including a metal layer 1104 is formed over the gate dielectric 1102 (e.g. over the IL and the high-K dielectric layer). The metal layer 1104 may include a metal, metal alloy, or metal silicide. Additionally, the formation of the gate dielectric/metal gate stack may include depositions to form various gate materials, one or more liner layers, and one or more CMP processes to remove excessive gate materials and thereby planarize a top surface of the device 300.

In some embodiments, the metal layer 1104 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 1104 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer 1104 may be formed by ALD, PVD, CVD, e-beam evaporation, or other suitable process. Further, the metal layer 1104 may be formed separately for N-type and P-type transistors which may use different metal layers. In addition, the metal layer 1104 may provide an N-type or P-type work function, may serve as a transistor (e.g., GAA transistor) gate electrode, and in at least some embodiments, the metal layer 1104 may include a polysilicon layer. With respect to the devices shown and discussed, the gate structure includes portions that interpose each of the epitaxial layers 310, which each provide semiconductor channel layers for the GAA transistors.

Figure 11B:
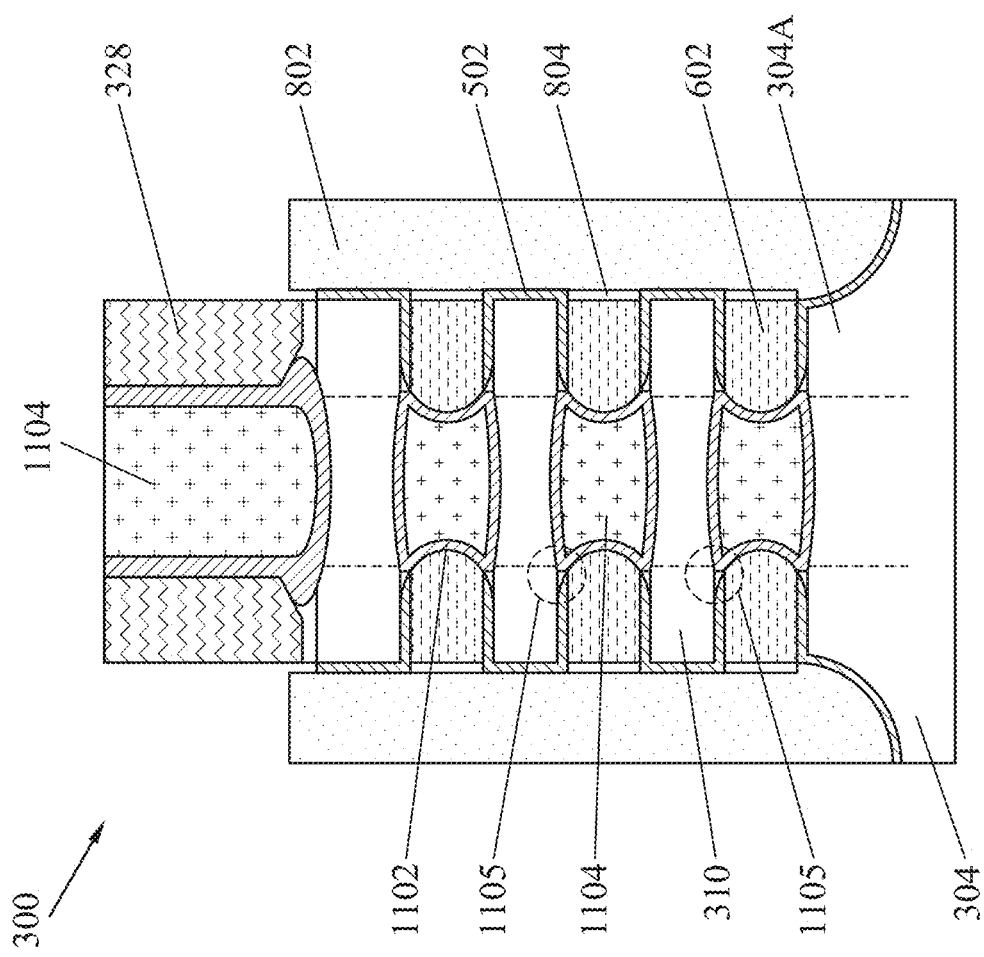
Figure 11C:
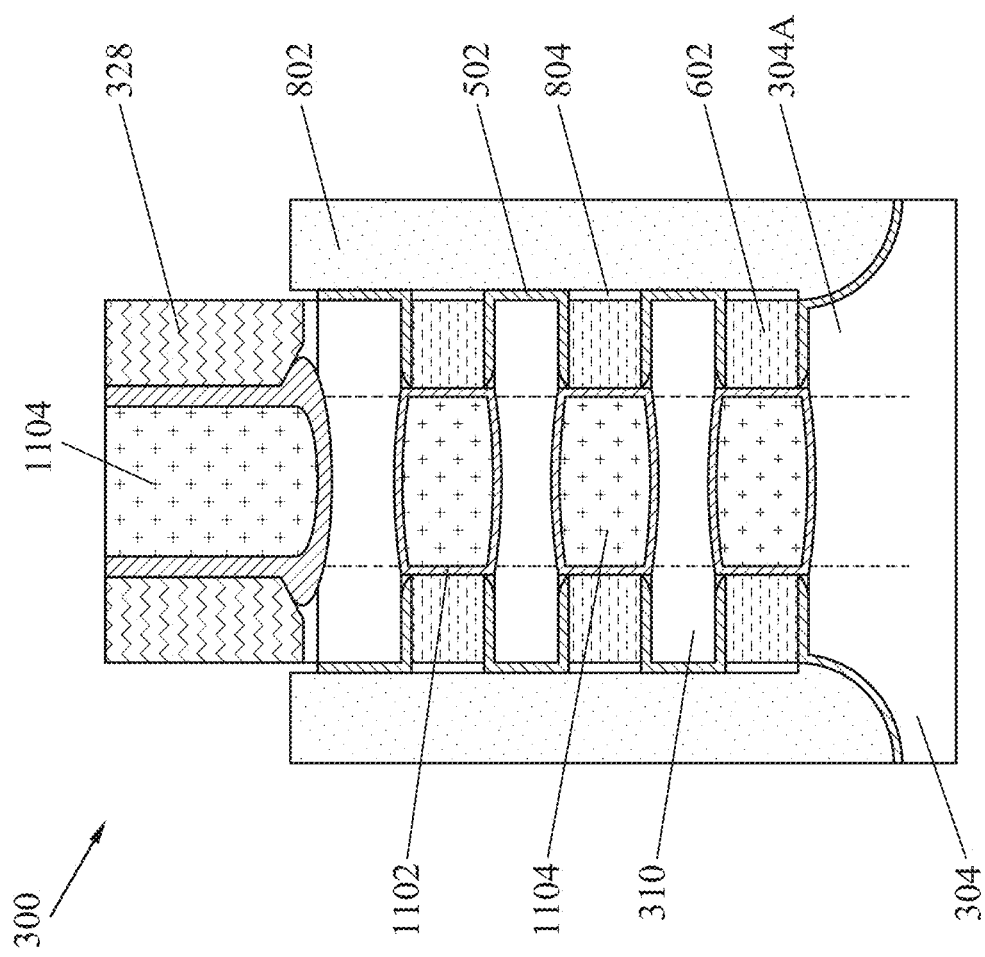

In various examples, the shape of the gate dielectric 1102 and the metal layer 1104 of the final structure of the device 300 may vary, for example, based on the surface profile along lateral sides of the gaps 902 resulting from the optional sheet trim process of block 218, as discussed above with reference to FIGS. 10A/10B/10C. For example, if the sheet trim process results in a concave profile (FIG. 10A), then the gate dielectric 1102 and the metal layer 1104 will also have a concave profile on opposing lateral sides as shown in FIG. 11A. Alternatively, if the sheet trim process results in a convex profile (FIG. 10B), then the gate dielectric 1102 and the metal layer 1104 will also have a convex profile on opposing lateral sides as shown in FIG. 11B. Further, if the sheet trim process results in a flat (vertical) profile (FIG. 10C), then the gate dielectric 1102 and the metal layer 1104 will also have a flat (vertical) profile on opposing lateral sides as shown in FIG. 11C.

Generally, the semiconductor device 300 may undergo further processing to form various features and regions known in the art. For example, further processing may form various contacts/vias/lines and multilayer interconnect features (e.g., metal layers and interlayer dielectrics) on the substrate 304, configured to connect the various features to form a functional circuit that may include one or more multi-gate devices (e.g., one or more GAA transistors). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be modified, replaced, or eliminated in accordance with various embodiments of the method 200.

Figure 12:
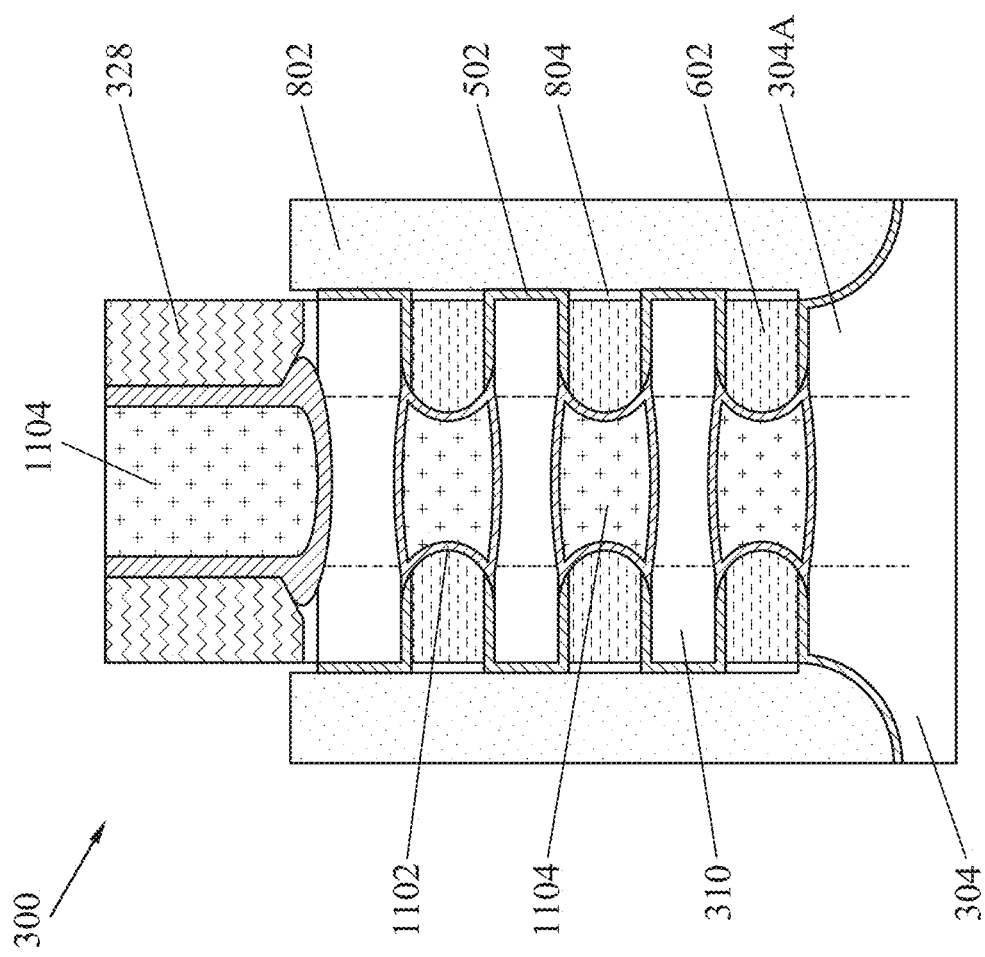

As one additional example, reference is made once again to FIG. 11B, which illustrates voids 1105 that may be present in corner regions of the gate dielectric 1102/metal layer 1104 adjacent to the cap layers 502, the inner spacers 602, and the epitaxial layers 310 (semiconductor channel layers) after formation of the gate dielectric 1102/metal layer 1104. In some alternative embodiments, and during formation of the gate dielectric 1102, the gate dielectric 1102 may be deposited such that the regions where the voids 1105 would potentially be formed are instead filled with the gate dielectric 1102, as shown in FIG. 12. As a result, the device 300 of FIG. 12 does not include the voids 1105. It is noted that similar deposition of the gate dielectric 1102 to fill any potential voids may be likewise performed for devices having other profiles on opposing lateral sides (e.g., such as shown in FIGS. 11A and 11C).

With respect to the description provided herein, disclosed are methods and structures for providing multi-gate devices (e.g., such as a GAA transistors) having an H-shaped (or dog-boned shaped) semiconductor channel layer. In some examples, devices fabricated in accordance with the present embodiments provide for better current spreading at the LDD region, which in turn results in reduced parasitic resistances. At least some embodiments also provide for stronger channel strain efficiency from a S/D stressor. Further, various embodiments provide for good short-channel control by maintaining a thin semiconductor channel layer. In some embodiments, the thin semiconductor channel layer thickness in an epitaxially grown super lattice is possible, while having little (or no) sheet trim at RPG, thereby improving uniformity of the semiconductor channel layer thickness. Further, in some embodiments, a thinner semiconductor channel layer thickness may correspond to a thicker dummy layer thickness, where the thicker dummy layer helps to facilitate removal of the dummy layer at RPG and improves metal gate gap fill or multi work-function metal patterning. At least some aspects of the various embodiments and advantages discussed herein are enabled by the use of a Si cap layer that is formed after the dummy layer recess and before inner spacer formation. In some examples, the Si cap layer may also help to prevent inner spacer and S/D damage during the dummy layer removal process. In some cases, the extra Si cap layer may contribute to the thicker semiconductor channel layer under the gate sidewall spacer, which also helps to provide the H-shaped (or dog-boned shaped) semiconductor channel layer. Those of skill in the art will readily appreciate that the methods and structures described herein may be applied to a variety of other semiconductor devices to advantageously achieve similar benefits from such other devices without departing from the scope of the present disclosure. For example, GAA devices fabricated in accordance with the methods described herein may be used to form other types of devices and circuits such as memory devices (e.g., such as SRAM, DRAM, etc.), logic circuits, or other types of electronic devices and/or circuits.

Thus, one of the embodiments of the present disclosure described a method including providing a fin extending from a substrate, where the fin includes an epitaxial layer stack having a plurality of semiconductor channel layers interposed by a plurality of dummy layers. In some embodiments, the method further includes removing a portion of the epitaxial layer stack within a source/drain region of the semiconductor device to form a trench in the source/drain region that exposes lateral surfaces of the plurality of semiconductor channel layers and the plurality of dummy layers. After forming the trench, in some examples, the method further includes performing a dummy layer recess process to laterally etch ends of the plurality of dummy layers to form first recesses along a sidewall of the trench. In some embodiments, the method further includes conformally forming a cap layer along the exposed lateral surfaces of the plurality of semiconductor channel layers and within the first recesses.

In another of the embodiments, discussed is a method that includes providing a fin structure including epitaxial layers of a first composition interposed by epitaxial layers of a second composition, where the epitaxial layers of the first composition are at least twice as thick as the epitaxial layers of the second composition. In some embodiments, the method further includes forming a dummy gate over the fin structure and a spacer layer on sidewalls of the dummy gate. The method further includes etching lateral ends of the epitaxial layers of the first composition to form recesses, the recesses disposed beneath the spacer layer and between adjacent epitaxial layers of the second composition. In some examples, the method further includes forming a silicon (Si) cap layer on opposing ends of the epitaxial layers of the second composition and within the recesses.

In yet another of the embodiments, discussed is a semiconductor device including a fin extending from a substrate, where the fin includes a plurality of semiconductor channel layers, and where each semiconductor channel layer of the plurality of semiconductor channel layers includes a channel region and a lightly-doped drain (LDD) region. In some embodiments, the semiconductor device further includes a cap layer surrounding the LDD region of each semiconductor channel layer of the plurality of semiconductor channel layers. In various examples, the semiconductor device further includes inner spacers disposed between first portions of the cap layer disposed in the LDD region of adjacent semiconductor channel layers of the plurality of semiconductor channel layers. In some embodiments, a first thickness of the plurality of semiconductor channel layers in the LDD region combined with a second thickness of the cap layer provides an effective thickness of the plurality of semiconductor channel layers in the LDD region, and the effective thickness is greater than a third thickness of the plurality of semiconductor channel layers in the channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a fin extending from a substrate, wherein the fin includes a plurality of semiconductor channel layers, and wherein each semiconductor channel layer of the plurality of semiconductor channel layers includes a channel region and a lightly-doped drain (LDD) region;
   a cap layer surrounding the LDD region of each semiconductor channel layer of the plurality of semiconductor channel layers; and
   inner spacers disposed between first portions of the cap layer disposed in the LDD region of adjacent semiconductor channel layers of the plurality of semiconductor channel layers;
   wherein a first thickness of the plurality of semiconductor channel layers in the LDD region combined with a second thickness of the cap layer provides an effective thickness of the plurality of semiconductor channel layers in the LDD region, and wherein the effective thickness is greater than a third thickness of the plurality of semiconductor channel layers in the channel region.

2. The semiconductor device of claim 1, further comprising:
   a portion of a gate structure disposed between channel regions of adjacent semiconductor channel layers of the plurality of semiconductor channel layers, wherein the inner spacers are further disposed on either side of the portion of the gate structure.

3. The semiconductor device of claim 2, further comprising:
   source/drain features disposed on either side of the gate structure and in contact with second portions of the cap layer disposed on lateral surfaces of each semiconductor channel layer of the plurality of semiconductor channel layers.

4. The semiconductor device of claim 1, wherein the cap layer includes a silicon (Si) layer.

5. The semiconductor device of claim 1, wherein the cap layer includes a first material composition that is the same as a second material composition of the plurality of semiconductor channel layers.

6. The semiconductor device of claim 3, further including a void disposed between the source/drain features and at least one adjacent inner spacer.

7. The semiconductor device of claim 1, wherein the channel region of each semiconductor channel layer of the plurality of semiconductor channel layers has recessed top and bottom surfaces.

8. The semiconductor device of claim 7, further comprising:
   a portion of a gate structure disposed between channel regions of adjacent semiconductor channel layers of the plurality of semiconductor channel layers, wherein the portion of the gate structure is in contact with the recessed top and bottom surfaces of respective ones of the adjacent semiconductor channel layers.

9. The semiconductor device of claim 2, wherein surfaces of the inner spacers that face the portion of the gate structure have a convex profile.

10. A semiconductor device, comprising:
    a gate stack formed over a channel region of a fin element, the fin element including a plurality of channel layers;
    spacer layers disposed on sidewalls of a top portion of the gate stack, wherein portions of the plurality of channel layers disposed beneath the spacer layers define lightly-doped drain (LDD) regions; and
    a cap layer disposed on surfaces of each of the plurality of channel layers in the LDD regions, wherein the cap layer contributes to an effective thickness of each of the plurality of channel layers in the LDD regions, and wherein the effective thickness of each of the plurality of channel layers in the LDD regions is greater than a thickness of each of the plurality of channel layers in the channel region.

11. The semiconductor device of claim 10, wherein the spacer layers are disposed over a top surface of a topmost channel layer of the plurality of channel layers in the LDD regions, and wherein the cap layer is disposed on lateral and bottom surfaces of the topmost channel layer in the LDD regions.

12. The semiconductor device of claim 10, wherein for a channel layer beneath a topmost channel layer of the plurality of channel layers, the cap layer is disposed on lateral, top, and bottom surfaces of the channel layer in the LDD regions.

13. The semiconductor device of claim 10, further comprising:
    inner spacers interposing the cap layer formed in the LDD regions of adjacent channel layers of the plurality of channel layers.

14. The semiconductor device of claim 13, wherein a portion of the gate stack is disposed between adjacent channel layers of the plurality of channel layers, and wherein the inner spacers are disposed on opposing sides of the portion of the gate stack.

15. The semiconductor device of claim 10, further comprising:
    source/drain features disposed on either side of the gate stack and in contact with portions of the cap layer disposed on lateral surfaces of each of the plurality of channel layers.

16. The semiconductor device of claim 10, wherein the cap layer includes a silicon (Si) layer.

17. The semiconductor device of claim 15, further including a void disposed between the source/drain features and an inner spacer interposing the cap layer formed in the LDD regions of adjacent channel layers of the plurality of channel layers.

18. The semiconductor device of claim 14, wherein surfaces of the inner spacers that face the portion of the gate stack have a convex profile or a concave profile.

19. A semiconductor device, comprising:
- a fin including multiple channel layers;
- a cap layer formed in a lightly-doped drain (LDD) region over ends of the multiple channel layers;
- inner spacers formed in the LDD region between adjacent ones of the multiple channel layers; and
- a portion of a gate stack disposed between adjacent ones of the multiple channel layers, wherein the inner spacers are disposed on opposing lateral sides of the portion of the gate stack;
- wherein an effective thickness of the multiple channel layers in the LDD region is different than a thickness of the multiple channel layers in a channel region of the multiple channel layers.

20. The semiconductor device of claim 19, wherein a first thickness of the multiple channel layers in the LDD region combined with a second thickness of the cap layer provides the effective thickness of the multiple channel layers in the LDD region, and wherein the effective thickness is greater than the thickness of the multiple channel layers in the channel region.

* * * * *